US009640389B2

(12) United States Patent
Vizbaras et al.

(10) Patent No.: US 9,640,389 B2
(45) Date of Patent: May 2, 2017

(54) HIGH-MOBILITY SEMICONDUCTOR HETEROSTRUCTURES

(71) Applicant: Brolis Semiconductors Ltd., Vilnius (LT)

(72) Inventors: Augustinas Vizbaras, Vilnius (LT); Kristijonas Vizbaras, Vilnius (LT)

(73) Assignee: BROLIS SEMICONDUCTORS LTD., Vilnius (LT)

( * ) Notice: Subject to any disclaimer, the term of this patent is extended or adjusted under 35 U.S.C. 154(b) by 19 days.

(21) Appl. No.: 14/742,232

(22) Filed: Jun. 17, 2015

(65) Prior Publication Data
US 2015/0364547 A1 Dec. 17, 2015

Related U.S. Application Data

(60) Provisional application No. 62/013,131, filed on Jun. 17, 2014.

(51) Int. Cl.
*H01L 29/778* (2006.01)
*H01L 21/02* (2006.01)
(Continued)

(52) U.S. Cl.
CPC .. *H01L 21/02463* (2013.01); *H01L 21/02395* (2013.01); *H01L 21/02466* (2013.01);
(Continued)

(58) Field of Classification Search
CPC ............. H01L 29/66431; H01L 29/778; H01L 29/7781; H01L 29/7782; H01L 29/7786
See application file for complete search history.

(56) References Cited

U.S. PATENT DOCUMENTS 4,912,451 A    3/1990   Sugiyama et al.
5,442,221 A    8/1995   Mosser et al.
(Continued)

FOREIGN PATENT DOCUMENTS

JP       2012-89651      5/2012

OTHER PUBLICATIONS

Friedland et al., "New Concept for the reduction of impurity scattering in remotely doped GaAs quantum wells," *Phys. Rev. Lett.*, vol. 77, No. 22, 1996.
(Continued)

*Primary Examiner* — Jae Lee
(74) *Attorney, Agent, or Firm* — Goodwin Procter LLP

(57) ABSTRACT

A layer structure and method of fabrication of a semiconductor heterostructure containing a two-dimensional electron gas (2DEG), two-dimensional hole gas (2DHG), or a two-dimensional electron/hole gas (2DEHG). The heterostructure contains a quantum well layer with 2DEG, 2DHG, or 2DEHG embedded between two doped charge reservoir layers and at least two remote charge reservoir layers. Such scheme allows reducing the number of scattering ions in the proximity of the quantum well as well a possibility for a symmetric potential for the electron or hole wavefunction in the quantum well, leading to significant improvement in carrier mobility in a broad range of 2DEG or 2DHG concentration in the quantum well. Embodiments of the invention may be applied to the fabrication of galvano-magnetic sensors, HEMT, pHEMT, and MESFET devices.

32 Claims, 6 Drawing Sheets

(51) Int. Cl.
  *H01L 29/36* (2006.01)
  *H01L 29/12* (2006.01)
  *H01L 29/205* (2006.01)
  *H01L 43/06* (2006.01)

(52) U.S. Cl.
  CPC .. *H01L 21/02507* (2013.01); *H01L 21/02546* (2013.01); *H01L 21/02549* (2013.01); *H01L 29/122* (2013.01); *H01L 29/365* (2013.01); *H01L 29/205* (2013.01); *H01L 29/7785* (2013.01); *H01L 43/065* (2013.01)

(56) References Cited

U.S. PATENT DOCUMENTS

| | | | |
|---|---|---|---|
| 5,456,206 | A | 10/1995 | Lee et al. |
| 5,657,189 | A | 8/1997 | Sandhu |
| 6,316,124 | B1 | 11/2001 | Boos et al. |
| 7,388,235 | B2 | 6/2008 | Boos et al. |
| 2003/0123829 | A1* | 7/2003 | Taylor ............ H01L 29/7785 385/131 |
| 2014/0138746 | A1 | 5/2014 | Abrokwah et al. |

OTHER PUBLICATIONS

Hayne et al., "Remote impurity scattering in modulation-doped GaAs/Al$_x$Ga$_{1-x}$As heterojunctions", *Phys. Rev. B.*, vol. 57, No. 23, 1998.
International Search Report and Written Opinion in PCT/EP2014/062672 dated Mar. 17, 2015, 11 pages.
Kraus et al., "Optimization of the doping levels in doubly doped InAlAs/InGaAs HEMTs," Compound Semiconductors 1997, Proceedings of the IEEE24th International Symposium on Compound Semiconductors, San Diego, CA, Sep. 8-11, 1997, pp. 503-508.
Saxena et al., "Determination of alloy scattering potential in Ga$_{1-x}$Ai$_x$As alloys," *J. Appl. Phys.*, vol. 58, 2640, 1985.
Tuttle et al., "Effects of interface layer sequencing on the transport properties of InAs/ AlSb quantum wells: evidence for antisite donors at the InAs/AlSb interface," *J. Appl. Phys.*, 67, 3032 (1990).
International Search Report and Written Opinion mailed Nov. 18, 2013 in PCT/EP2013/0717, 12 pages.
Pavlovska, et al., "In situ studies of the role of excess Ga on the growth morphology of thin GaN layers," Surface Science, vol. 496, (2002), pp. 160-178.
International Preliminary Report and Written Opinion mailed Dec. 20, 2016 in PCT/EP2014/062672, 7 pages.

\* cited by examiner

HIGH-MOBILITY SEMICONDUCTOR HETEROSTRUCTURES

RELATED APPLICATION

This application claims the benefit of priority to U.S. Provisional Application Ser. No. 62/013,131 filed Jun. 17, 2014, which is incorporated herein by reference in its entirety.

FIELD OF THE INVENTION

Embodiments of the invention relate generally to semiconductor structures, and particularly to high mobility semiconductor heterostructures.

BACKGROUND OF THE INVENTION

Two-dimensional electron gas systems such as quantum wells exhibit quantized electronic states in one dimension and have a step-like density of states. The charge carriers are thus localized in one dimension (i.e., growth direction) and can freely move in the in-plane directions. See U.S. Pat. No. 5,442,221, incorporated herein by reference in its entirety.

Localized charge carriers exhibit high in-plane mobility in a wide charge carrier concentration range, which can be precisely controlled by conventional epitaxial crystal growth. Carrier mobility is limited by carrier scattering mechanisms that are typically dominated by optical phonon scattering, ionized impurity scattering and alloy scattering when alloys containing more than 2 atoms are used—i.e., ternary (3 atoms), quaternary (4 atoms) and quinternary (5 atoms) alloys. See M. Hayne et al. "Remote impurity scattering in modulation-doped GaAs/Al$_x$Ga$_{1-x}$As heterojunctions", Phys. Rev. B., Vol. 57, No. 23, 1998; and A. K. Saxena, A. R. Adams, "Determination of alloy scattering potential in Ga$_{1-x}$Al$_x$As alloys," J. Appl. Phys., Vol. 58, 2640, 1985, incorporated herein by reference in their entireties.

Increasing carrier mobilities is a key challenge in semiconductor device fabrication processes. See, e.g., K.-J. Friedland, R. Hey, H. Kostial, R. Klann, and K. Ploog, "New Concept for the reduction of impurity scattering in remotely doped GaAs quantum wells," Phys. Rev. Lett., Vol. 77, No. 22, 1996, and U.S. Pat. Nos. 4,912,451; 5,657,189; 7,388,235; and 6,316,124, incorporated herein by reference in their entireties.

SUMMARY

In an aspect, some embodiments of the invention include a semiconductor heterostructure including a layer structure. The layer structure has a first charge reservoir layer, a second charge reservoir layer, a third charge reservoir layer, and a fourth charge reservoir layer disposed over a substrate, each charge reservoir layer including a dopant type of, e.g., donors or acceptors. An undoped quantum well layer is disposed between the second and third charge reservoir layers. The first charge reservoir layer is disposed over the substrate, the second charge reservoir layer is disposed over the first charge reservoir layer, the third charge reservoir layer is disposed over the second reservoir layer, and the fourth charge reservoir layer is disposed over the third charge reservoir layer. The first and fourth charge reservoir layers are remote from the quantum well layer, and the second and third charge reservoir layers are proximate the quantum well layer.

One or more of the following features may be included. The second and third charge reservoir layers between which the quantum well layer is disposed include a first type of dopant, an interface between a top surface of the layer structure and air includes a second type of surface states, and the first and second types are different.

A sheet doping density of at least one of the charge reservoir layers remote from the quantum well layer is substantially equal to a surface state sheet density of the layer structure.

At least one of the charge reservoir layers remote from the quantum well layer may include a first type of dopant, an interface between the substrate and the layer structure may include a second type of interface states, and the first type may be different from the second type. A sheet carrier density of the charge reservoir layer disposed closest to the substrate is substantially equal to an interface state sheet density of the interface.

The substrate may be lattice-matched to the layer structure, e.g., the layer structure may include at least one of (AlGaIn)(As)-containing layers disposed on a GaAs substrate and (AlGaIn)(AsP)-containing layers disposed on an InP substrate.

The substrate may not be lattice-matched to the layer structure. The layer structure may include (AlGaIn)(AsSb)-containing layers disposed on a GaAs substrate.

The two charge reservoir layers proximate the quantum well layer may include dopants of the same type at substantially equal concentrations.

The charge reservoir layers remote from the quantum well layer may have a dopant type and concentration that enables the incorporation of a reduced dopant concentration in the two charge reservoir layers proximate the quantum well layer in comparison to a heterostructure without the remote charge reservoir layers, while maintaining constant a carrier concentration in the quantum well layer.

A plurality of layers may be disposed between one of the charge reservoir layers proximate the quantum layer and the charge reservoir layers remote from the quantum well layer. A spacer layer including, e.g., aluminum, may be disposed between one of the charge reservoir layers proximate the quantum well layer and one of the charge reservoir layer remote from the quantum well layer. An upper barrier layer and/or a cap layer may be disposed over the fourth charge reservoir layer. The upper barrier layer comprises aluminum. The cap layer may be substantially free of aluminum.

The quantum well layer may include at least a ternary composition, with the layer structure further including a first binary material layer disposed between the quantum well layer and one of the two proximate charge reservoir layers. A second binary material layer may be disposed between the quantum well layer and the second of the two proximate charge reservoir layers.

An electronic device may include the semiconductor heterostructure. The electronic device may include a magnetic sensor, e.g., a galvano-magnetic sensor. The electronic device may be a transistor, such as a high-electron-mobility transistor, a pseudomorphic high-electron-mobility transistor, or a metal-oxide-semiconductor field effect transistor.

In another aspect, embodiments of the invention include a method for manufacturing a semiconductor heterostructure, the method including forming sequentially a first, a second, a third, and a fourth charge reservoir layer over a substrate, each charge reservoir layer comprising a dopant type, e.g., donors or acceptors. An undoped quantum well layer is formed between the second and third charge reservoir layers.

One or more of the following features may be included. Forming at least one of the charge reservoir layers may include forming a delta-doped layer, e.g., by molecular beam epitaxy or metalorganic chemical vapor deposition.

Forming at least one of the charge reservoir layers may include growing an undoped layer and subsequently doping the undoped layer. The undoped layer may be formed by molecular beam epitaxy or metalorganic chemical vapor deposition. The undoped layer may be doped by ion implantation and/or diffusion.

Forming at least one of the charge reservoir layers may include forming a doped layer by molecular beam epitaxy or metalorganic chemical vapor deposition.

The quantum well layer may be formed between the second and third charge reservoir layers.

A spacer layer may be formed between one of the charge reservoir layers proximate the quantum well layer and one of the charge reservoir layers remote from the quantum well layer.

An upper barrier layer and/or a cap layer is formed over the fourth charge reservoir layer.

In another aspect, embodiments of the invention include a semiconductor heterostructure having a layer structure. The layer structure has a second charge reservoir layer disposed over a substrate, and a third charge reservoir layer disposed over the second charge reservoir layer. A first charge reservoir layer is disposed between the second charge reservoir layer and the substrate; and/or a fourth charge reservoir layer is disposed over the third charge reservoir layer. Each charge reservoir layer includes a dopant type of, e.g., donors or acceptors. An undoped quantum well layer is disposed between the second and third charge reservoir layers.

In another aspect, embodiments of the invention include a semiconductor heterostructure having a layer structure. The layer structure has a first charge reservoir layer, a second charge reservoir layer and a third charge reservoir layer disposed over a substrate, each charge reservoir layer including a dopant type of, e.g., donors and acceptors. An undoped quantum well layer is disposed between two of the charge reservoir layers.

One or more of the following features may be included. The two charge reservoir layers between which the quantum well layer is disposed include a first type of dopant, an interface between a top surface of the layer structure and air include a second type of surface states, and the first and second types are different.

A sheet doping density of the charge reservoir layer remote from the quantum well layer is substantially equal to a surface state sheet density of the layer structure.

The charge reservoir layer remote from the quantum well layer may include a first type of dopant, an interface between the substrate and the layer structure may include a second type of interface states, and the first type may be different from the second type. A sheet carrier density of the charge reserve layer disposed closest to the substrate is substantially equal to an interface state sheet density of the interface.

The substrate may be lattice-matched to the layer structure, e.g., the layer structure may include (AlGaIn)(As)-containing layers disposed on a GaAs substrate or (AlGaIn)(AsP)-containing layers disposed on an InP substrate.

The substrate may not be lattice-matched to the layer structure. The layer structure may include (AlGaIn)(AsSb)-containing layers disposed on a GaAs substrate.

The two charge reservoir layers proximate the quantum well layer may include dopants of the same type at substantially equal concentrations.

The charge reservoir layer remote from the quantum well layer may have a dopant type and concentration that enables the incorporation of a reduced dopant concentration in the two charge reservoir layers proximate the quantum well layer in comparison to a heterostructure without the remote charge reservoir layer, while maintaining constant a carrier concentration in the quantum well layer.

A plurality of layers may be disposed between one of the charge reservoir layers proximate the quantum layer and the charge reservoir layer remote from the quantum well layer. A spacer layer including, e.g., aluminum, may be disposed between one of the charge reservoir layers proximate the quantum well layer and the charge reservoir layer remote from the quantum well layer. An upper barrier layer and/or a cap layer may be disposed over the third charge reservoir layer. The upper barrier layer may include aluminum. The cap layer may be substantially free of aluminum.

The quantum well layer may include at least a ternary composition, with the layer structure further including a first binary material layer disposed between the quantum well layer and one of the two proximate charge reservoir layers. A second binary material layer may be disposed between the quantum well layer and the second of the two proximate charge layers.

An electronic device may include the semiconductor heterostructure. The electronic device may include a magnetic sensor, e.g., a galvano-magnetic sensor. The electronic device may be a transistor, such as a high-electron-mobility transistor, a pseudomorphic high-electron-mobility transistor, or a metal-oxide-semiconductor field effect transistor.

In another aspect, embodiments of the invention include a method for manufacturing a semiconductor heterostructure, the method including forming sequentially a first, a second, and a third charge reservoir layer over a substrate, each charge reservoir layer comprising a dopant type, e.g., donors or acceptors. An undoped quantum well layer is formed between two of the charge reservoir layers.

One or more of the following features may be included. Forming at least one of the charge reservoir layers may include forming a delta-doped layer, e.g., by molecular beam epitaxy or metalorganic chemical vapor deposition.

Forming at least one of the charge reservoir layers may include growing an undoped layer and subsequently doping the undoped layer. The undoped layer may be formed by molecular beam epitaxy or metalorganic chemical vapor deposition, and the undoped layer may be formed by ion implantation and/or diffusion.

Forming at least one of the charge reservoir layers may include forming a doped layer by molecular beam epitaxy or metalorganic chemical vapor deposition.

The quantum well layer may be formed between the first and second charge reservoir layers. Alternatively, the quantum well layer may be formed between the second and third charge reservoir layers.

A spacer layer may be formed between one of the charge reservoir layers proximate the quantum well layer and the charge reservoir layer remote from the quantum well layer.

An upper barrier layer and/or a cap layer may be formed over the third charge reservoir layer.

BRIEF DESCRIPTION OF DRAWINGS

FIGS. 6a and 6b are graphs of experimental data obtained for a metamorphic high-mobility structure, in which FIG. 6a is a plot of carrier mobility vs. carrier concentration in the remote first charge reservoir layer and FIG. 6b is a plot of carrier concentration in the quantum well vs. carrier concentration in the remote first charge layer, with trap states at the substrate interface being dominant.

DETAILED DESCRIPTION

Embodiments of the invention include a structure that reduces the effect of ionized impurity scattering and, in certain cases, alloy scattering mechanisms. The described structure and method of manufacturing enable the achievement of high charge carrier mobility in a wide carrier concentration range in a reproducible and controlled way in both lattice-matched material systems as well as strongly mismatched systems, i.e., metamorphic systems in which thick buffer layers act as virtual substrates.

High-mobility semiconductor heterostructures typically include at least one low-bandgap layer embedded between two higher bandgap materials, forming a quantum well with a two-dimensional electron gas (2DEG), a two-dimensional hole gas (2DHG), or a type I quantum well with two-dimensional electron/hole carrier gas. For maximum performance in terms of mobility, the charge carriers are supplied by introducing impurities into one or both of the surrounding high-bandgap layers to reduce the 2DEG scattering by ionized impurity atoms. For optimal performance, the 2DEG resides in the ground state of the quantum well. The wavefunction is preferably kept symmetric to reduce the overlap with the surrounding materials and remote ionized impurities. However, due to interface effects, such as surface depletion or carrier enrichment due to a relaxed substrate/layer stack interface, or trap states associated with the substrate/epitaxial layer interface, attaining a symmetric wavefunction may be difficult to achieve.

Some embodiments of the invention include charge layers that are remote from the quantum well and are doped to compensate the interface effect. In the case of surface depletion, one charge layer is preferably positioned remote from the quantum well and closer to the top surface of the semiconductor/air interface.

Figure 1:
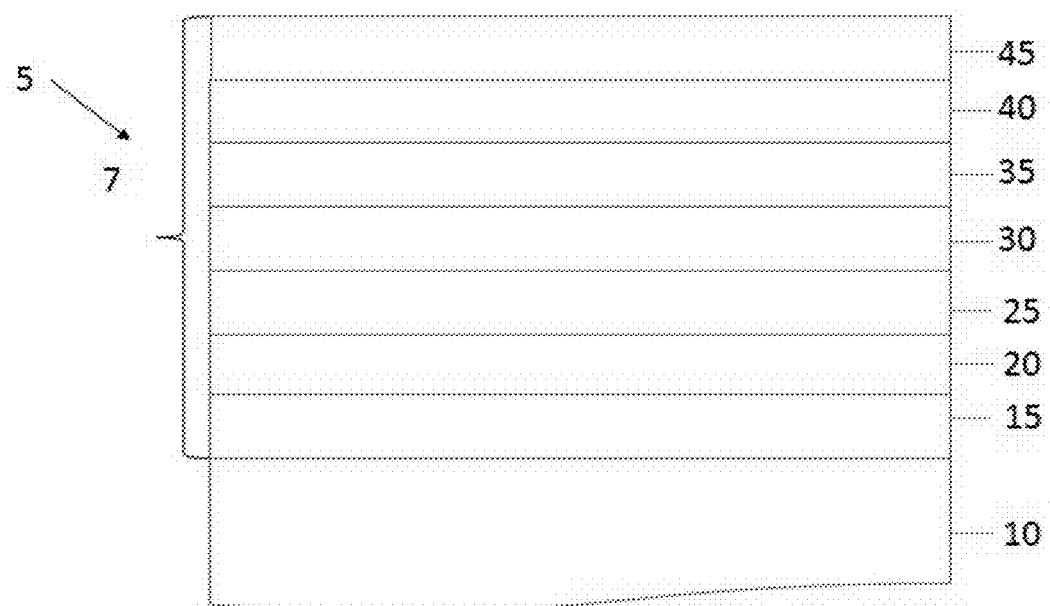
FIGS. 1, 2, and 5 are schematic cross-sectional diagrams illustrating exemplary heterostructures having four charge reservoir layers in accordance with embodiments of the invention.

In particular, referring to FIG. 1, a semiconductor heterostructure 5 may include a layer structure 7 disposed over a substrate 10. A first charge reservoir layer 15, which is a remote charge layer, may be disposed over the substrate 10. A second charge reservoir layer 25 may be separated from the first charge reservoir layer by a undoped spacer or buffer layer 20. An undoped quantum well layer 30 may be disposed over the second charge reservoir layer 25 and below third and fourth charge reservoir layers 35 and 45 respectively.

The third charge reservoir layer 35 is disposed over the second charge reservoir layer 25. The remote charge layers are the first and fourth charge reservoir layers 15 and 45, i.e., the charge reservoir layers closest to and farthest from the substrate. The presence of the remote charge reservoir layers, i.e., first and fourth charge reservoir layers 15 and 45, which are doped with impurity atoms (donors or acceptors, typically donors) to a certain concentration (e.g., to at least $10^{11}$ cm$^{-2}$), allows reducing the impurity ion concentration, i.e., donors or acceptors, in the two charge reservoir layers surrounding the quantum well, e.g., the second and third charge reservoir layers 25 and 35, while maintaining the 2DEG sheet carrier concentration in the quantum well constant.

Figure 2:
Figure 4:
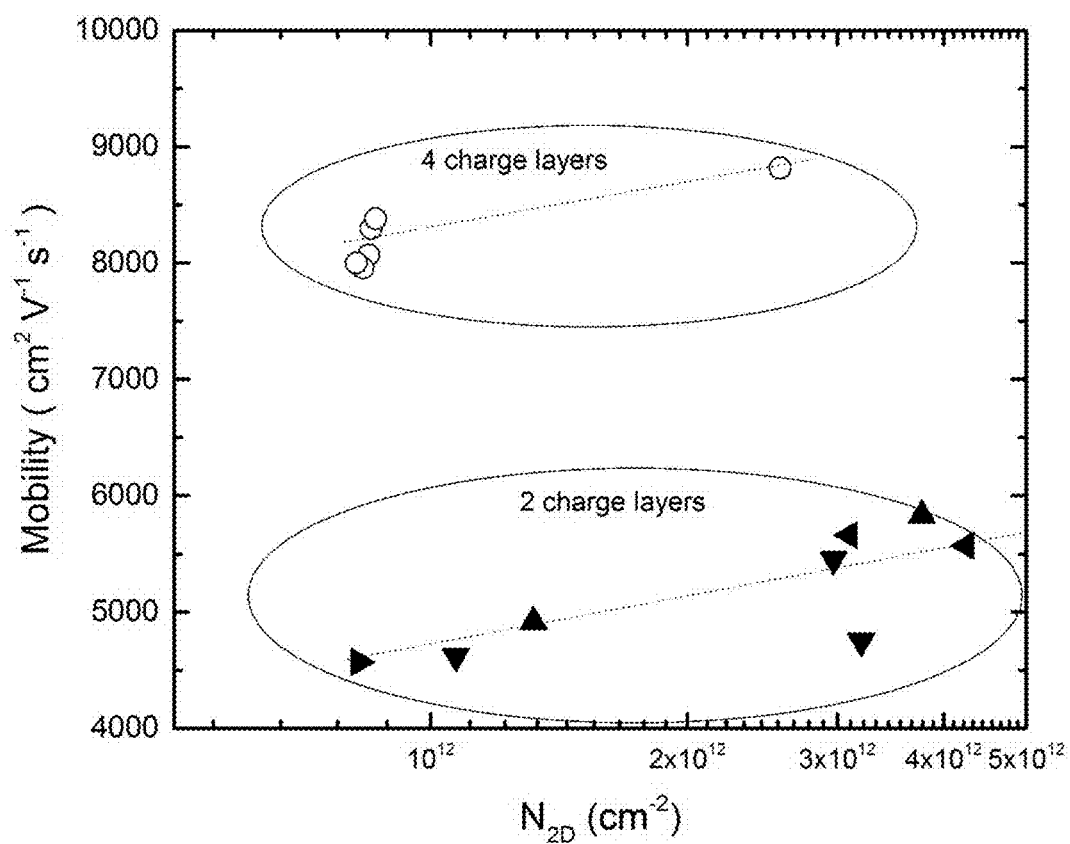
FIG. 4 is a graph illustrating experimental room-temperature electron mobilities attained in accordance with an embodiment of the invention having four charge reservoir layers and with a prior art structure with two charge reservoir layers.

A specific exemplary structure with four charge layers is shown in FIG. 2, which depicts an AlGaAs/GaInAs/GaAs lattice-matched high-mobility heterostructure. A comparison of carrier mobilities attained with an experimental structure to mobilities attained with a prior art structure is shown in FIG. 4.

The high-mobility semiconductor heterostructure can be, for example, realized in a III-V lattice-matched material system, such as $(AlGaIn)_1(As)_1$ on a GaAs substrate (FIG. 2), $(AlGaIn)_1(AsP)_1$ on an InP substrate or in III-V lattice-mismatched, or a pseudomorphic heterostructure such as $(AlGaIn)_1(AsSb)_1$ on a GaAs substrate. In an embodiment in which the epitaxial structure is grown lattice-matched on a GaAs substrate, the Al concentration in the barrier AlGaAs material may be below 40%. For an embodiment lattice-matched with an InP substrate, the Al concentration in the barrier material may not exceed 60%.

A high-mobility semiconductor heterostructure such as the structure depicted in FIG. 2 may be manufactured by conventional epitaxial growth techniques such as molecular beam epitaxy (MBE) or metal-organic chemical vapor deposition (MOCVD)(MOVPE). The growth is carried out on a semi-insulating substrate 10, including a suitable material, such as II-VI or III-V compounds or group IV elements. In the illustrated example, substrate 10 may be composed of GaAs. A superlattice 12 including a periodic repetition of thin high bandgap and low band gap material pairs is formed over the substrate 10. The superlattice is preferably sufficiently thick to suppress the propagation of threading dislocations from imperfections in the semi-insulating substrate 10. A suitable choice of materials for the superlattice may be AlAs as a high bandgap material and GaAs as a low bandgap material, as shown in FIG. 2. Typically, a superlattice thickness in the range of at least 10-50 nm is sufficient to suppress threading dislocation propagation.

The superlattice layer 12 is followed by a bulk buffer layer 13, typically composed of a high quality epitaxial material with a bandgap energy higher than that of the quantum well layer 30. In the exemplary structure illustrated in FIG. 2, the buffer layer 13 is formed of GaAs. The bulk buffer layer 13 is preferably sufficiently thick to allow a dislocation-free surface, and as thin as possible (to reduce growth time) while allowing a dislocation-free surface, e.g., between 50 nm-1000 nm. The lower buffer layer 13 is followed by growth of high-bandgap material lower barrier layer 14, typically Al-containing alloy $(AlGaIn)_1(AsSb)_1$, with the Al concentration in the alloy being non-zero and chosen to facilitate proper electron confinement in the narrow bandgap quantum well. This layer may be AlGaAs, lattice matched to the GaAs substrate 10. In an embodiment, a thickness of this layer is at least 1 nm, e.g., about 10 nm.

After the desired thickness of lower barrier layer 14 is attained, growth is interrupted and the wafer surface is exposed only to the dopant atoms, forming a 2D layer of impurity atoms of the desired type, typically n-type, to form the first remote charge reservoir layer 15. In some embodiments, a thickness of this 2D delta-doping layer is less than 1 monolayer. For example, the first charge reservoir layer 15 may be delta-doped with silicon atoms, acting as a donor type impurity Since electrons have a greater mobility than holes, n-type material is typically preferable for high-mobility structures, with donor-type impurities. Alternatively, the first charge reservoir layer 15 may be formed by depositing a suitable compound layer, e.g., a III-V layer such as GaAs, and then implanting impurity atoms, e.g., n-type dopants such as silicon. In embodiments in which the first charge reservoir layer is formed of a bulk layer, a thickness of this layer is preferably greater than 1 monolayer, e.g., several nanometers.

Formation of first charge reservoir layer 15 may be followed by growth of a high bandgap spacer layer 20, which typically has the same composition as the lower barrier layer 14. The purpose of spacer layer 16 is to physically separate the first charge reservoir layer 15 from the second charge reservoir layer 25, which acts as a charge supply layer to the quantum well layer 30. The second charge reservoir layer is again physically separated from the quantum well by including a high bandgap spacer layer 26, which in this example is again AlGaAs. This minimizes electron wavefunction overlap with ionized impurity atoms, resulting in less scattering. A quantum well thickness may be selected from a range of at least a few monolayers (at least 1 nm), up to 30 nm. A thickness of the spacer layer may be at least 1 nm, e.g., 5 nm.

In the exemplary structure depicted in FIG. 2, the undoped quantum well layer 30 may be composed of a ternary material such as $(GaIn)_1As_1$. In case of use of ternary quantum well material, in which both gallium and indium concentrations are non-zero, alloy scattering may be present and limit the maximum carrier mobility, and is enhanced at the interface between the high-bandgap Al-containing layer 26, where a quaternary AlGaInAs interface is present.

To avoid excess scattering at the interfaces, first and second binary material insert layers 27a, 27b, for example GaAs, can be embedded between spacer layer 26 and quantum well layer 30 and between quantum well layer 30 and spacer layer 31, respectively. The thicknesses of the lattice matched first and second binary insert 27a, 27b and the spacer layer 26 together are preferably sufficient to confine the exponential tail of the electronic wavefunction in the ground state of the quantum well. A combined thickness of these layers of a few to ten monolayers may be sufficient After the quantum well layer 30 is grown, a second binary material insert layer 27b is formed, followed by the growth of a high bandgap spacer layer 31. The spacer layer 21 may be formed from a group III-containing material, such as an Al-containing material. For improved performance the thickness of the first binary material insert layer 27a is preferably the same as that of binary insert layer 27b, and the spacer layer 26 thickness is preferably the same as that of spacer layer 31.

A symmetric potential is desired due to the symmetric nature of the electronic wavefunction in the ground state of the quantum well. Accordingly, the growth of the second spacer layer 31 is followed by the addition of a third delta-doped charge reservoir layer 35, which, ideally has the same impurity (i.e., dopant) type and concentration as the second charge reservoir layer 25 to induce a symmetric potential. Both of these charge layers serve as charge supply layer for the quantum well. In some embodiments, doping concentrations of the two charge supply layers may be selected from a range of $10^{11}$ cm$^{-2}$-$10^{13}$ cm$^{-2}$.

To counteract the surface depletion effect and to avoid the addition of excess donor atoms, additional functional layers may be added to the conventional high-mobility heterostructure, i.e., structures with only two charge reservoir layers. In particular, after the third charge reservoir layer 35 is formed, the high-bandgap material layer 40, e.g., an Al-containing material such as AlGaAs, may continue to be grown, followed by a fourth charge reservoir layer 45, which may be a Si-delta doped charge layer, with sheet donor concentration subsequently equal to the surface trap state sheet density. The intermediate spacer layer 40 may be sufficiently thick to decouple the third charge reservoir layer 35 and fourth charge reservoir layer 45. Typically, a thickness in the range of 10-1000 nm is sufficient. The fourth charge reservoir layer may be capped with a high-bandgap Al-containing upper barrier layer 46, followed by an Al-free capping layer 47, typically binary GaAs or ternary InGaAs, to avoid surface oxidation. The upper barrier layer 46 typically has a thickness of 10-50 nm, and a thickness of the capping layer 47 can range from few nm to 10 nm.

The structure with four charge reservoir layers described herein allows decoupling the inclusion of a desired carrier density in the quantum well layer and the compensation of the surface and substrate trap states to avoid the surface/epitaxial layer or substrate/epitaxial layer interface depletion or carrier enrichment.

Figure 3:
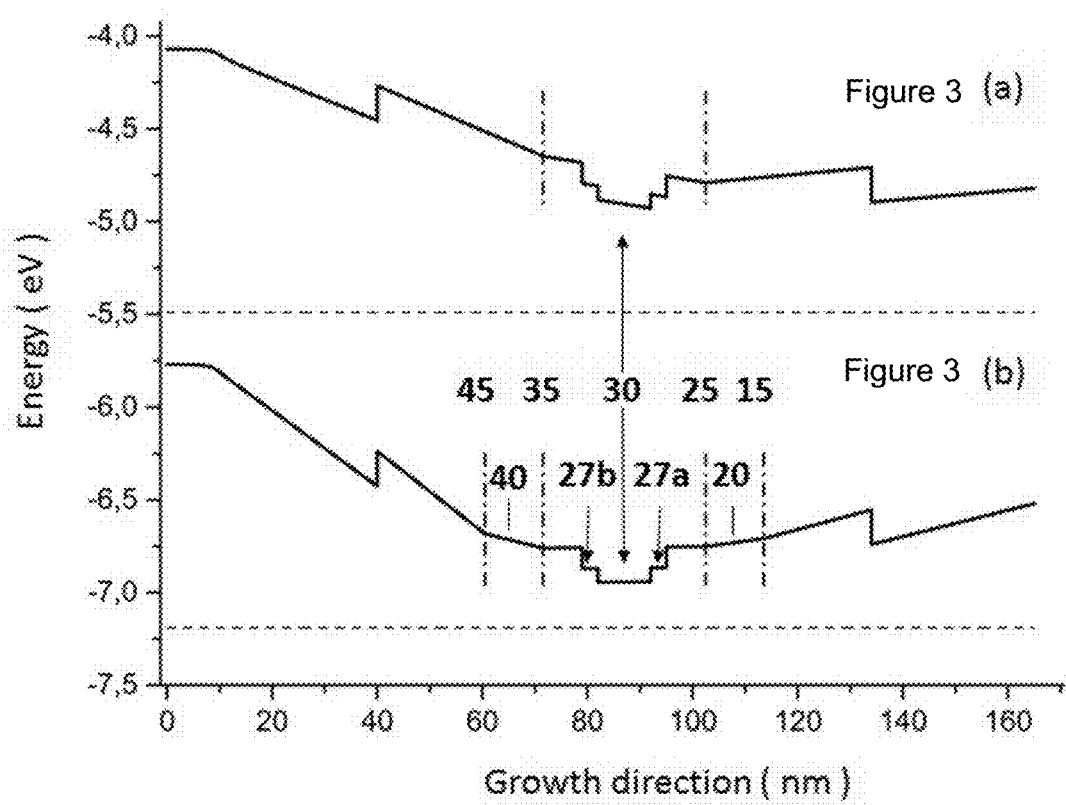
FIGS. 3a and 3b are graphs illustrating band structures for a structure with two charge layers in accordance with the prior art, and the structure of FIG. 2 with four charge layers, respectively.

FIG. 3a is a graph of a simulated conduction band structure for a conventional high-mobility semiconductor heterostructure with two charge layers, and FIG. 3b is a graph of a simulated conduction band structure for a high-mobility semiconductor heterostructure having four charge reservoir layers, in accordance with embodiments of the invention. For band diagram simulations, material parameters, bandgap energies and conduction and valence band offsets together with doping concentration were used as input parameters. Both type of structures were realized experimentally with different 2D electron densities in the quantum wells. Mobility data for experimental structures is presented in FIG. 4.

In fabricated structures, surface depletion, which is a result of Fermi level pinning at the surface layer of the structure, may lead to a carrier depletion in the quantum well layer. In the $(AlGaIn)_1(As)_1$ case illustrated in FIG. 2, the surface states are acceptor type. Thus an increase in the donor concentration in the third charge reservoir layer 35 is necessary to compensate for carrier depletion in the quantum well layer. However, the addition of donor atoms may lead to an increase in ionized impurity ion concentration, which in turn increases the rate of carrier scattering by ionized impurities and limits the maximum mobility. Moreover, the potential becomes asymmetric and induces the asymmetry in the wavefunction of the ground state, leading to a larger penetration of the wavefunction into the spacer layer 31 (FIG. 3a) where excess scattering by ionized impurity atoms in layer 35 occurs and limits the maximum carrier mobility. To counteract the asymmetry of the potential and the excess donor ions, embodiments of the invention include a fourth charge reservoir layer 45, positioned remote from the quantum well layer and closer to the surface interface (FIG. 3b).

The impurity sheet carrier concentration of the remote charge layer is preferably kept substantially equal to the sheet density of the surface states at the top layer/air interface. The presence of the remote charge reservoir layer allows the realization of a symmetric charge supply from the two charge layers surrounding the quantum well layer and a more symmetric potential of the 2DEG ground state (FIG. 3b), compared to a typical prior art structure in which only two charge layers are used (FIG. 3a). In the prior art case, to compensate for the surface depletion, the second charge layer 35 grown above the quantum well layer is typically doped much more (e.g., 2-4 times more) than the first charge reservoir layer 25. Moreover, the third and fourth remote charge layers 15 and 45, disclosed herein, are not present in conventional heterostructures. This leads to asymmetric potential of the quantum well and larger overlap of the 2DEG wavefunction with the barrier material and the ionized impurity atoms in the surrounding charge layers (FIG. 3a). This results in increased 2DEG scattering rate and lower mobility.

In summary, ideally, in a semiconductor heterostructure containing a quantum well, the lowest energy state for the charge carriers is the ground state of the quantum well. Thus, if one were to aim for a structure with a desired carrier concentration N in the quantum well, it would be reasonable to dope the two surrounding charge layers with dopant ion concentration of N/2 each for a symmetric charge supply and potential around the quantum well.

However, in actually fabricated devices, interface effects play a role. Accordingly, in the case of surface depletion, the Fermi level becomes pinned close to midgap due to surface states, leading to charge extraction from the two charge supply layers surrounding the quantum well, and in turn, to an asymmetric potential for the ground state in the quantum well. At the same time, substrate/heterostructure interface trap states can either deplete or enrich the quantum well with carriers, depending on the trap state type. This results in a carrier concentration in the quantum well being less or more than the desired N. In prior art cases, to overcome surface depletion, one of the two charge supply layers are doped substantially higher to compensate for the carrier extraction, while maintaining a constant carrier concentration in the quantum well (desired N). However, this may lead to excess impurity ions, with excess scattering and lower mobility.

If, in accordance with embodiments of the invention, one or more remote charge layer are present (i.e., formed during the crystal growth process), they immediately compensate for the Fermi level pinning, maintain a symmetric potential for the quantum well, and allow doping of the two charge supply layers to N/2 each and compensate for surface and substrate interface trap induced effects.

EXAMPLES

Example 1 if the surface state sheet density is $10^{12}$ cm$^{-2}$, then to achieve the carrier concentration of $10^{12}$ cm$^{-2}$ in the quantum well, the second charge reservoir layer 25 is preferably doped $5\times10^{11}$ cm$^{-2}$ and the third charge reservoir layer 35 is preferably intentionally doped at least $1.5\times10^{12}$ cm$^{-2}$, which is a factor of 3 higher than the required nominal doping, meaning that also the number of ionized impurity scattering centers is a factor of 3 higher.

Example 2

If this concept is applied to the example discussed for the dual charge reservoir structure, then to achieve the 2D carrier density in the quantum well of $10^{12}$ cm$^{-2}$, it is sufficient to dope the second charge reservoir layer 25 and the third charge reservoir layer 35 with donor concentration of $0.5\times10^{12}$ cm$^{-2}$ each, and dope the fourth charge reservoir layer 45 with donor concentration of $10^{12}$ cm$^{-2}$ to fully compensate the surface states. This allows the achievement of a fully symmetric potential as well as the reduction in scattering centers due to ionized impurity ions by a factor of 3. In turn, once the surface states are fully compensated by the inclusion of third charge reservoir layer 35, the carrier concentration in the quantum well layer can be precisely controlled by adjusting the doping level in the second and third charge reservoir layers 25, 35. Depending on the materials used for the fabricated semiconductor heterostructure and the quality of the substrate/heterostructure interface, the first remote charge reservoir layer is doped in accordance with the trap state density resulting from the interface. This can be adjusted experimentally, and can be as low as $0.5\times10^{11}$ cm$^{-2}$ for a good quality interface and as high as $5\times10^{12}$ cm$^{-2}$ for a pseudomorphic relaxed interface.

FIG. 4 illustrates experimental room-temperature mobility data as a function of 2D electron density in the quantum well for a prior art structure with two charge layers, and for a structure having additional remote charge layers, i.e., a total of four charge layers, in accordance with embodiments of the invention. Here, the experimental high-mobility heterostructure with four charge layers was formed from lattice-matched GaAs/AlGaAs/GaInAs materials, and the predominant interface effect is carrier depletion due to surface trap states that are compensated with the top remote charge reservoir layer. The remote bottom charge reservoir layer is kept at an order of magnitude lower doping density. However, a completely opposite behavior can be observed with pseudomorphic high-mobility heterostructures. In structures where a quantum well material has a lattice constant different from the lattice constant of the substrate material and lattice-matched growth is not possible, strongly mismatched metamorphic growth can be used. Such growth conditions lead to a completely relaxed interface between the substrate and the layer structure. An example of a metamorphic structure is a layer structure with an InAs or InSb quantum well grown on a GaAs substrate. Metamorphic structures may provide the advantage of using very high-mobility materials such as for example InAs or InSb on commercially available, low-cost substrates such as GaAs.

It is clearly demonstrated that once the symmetry of the potential is maintained, and the number of ionized donor atoms is kept low, the carrier mobility is kept high regardless of carrier concentration in the quantum well for a wide concentration range. In particular, as can be seen from FIG. 4, a structure with four charge reservoir layers provides a carrier mobility nearly twice the value attained with a conventional two charge reservoir layer high-mobility structure. The structures in which the carrier mobilities in FIG. 4 were measured are experimental versions of the simulated structures having the conduction band structures shown in FIGS. 3a and 3b. The experimental four charge reservoir layer structure is identical to the structure shown in FIG. 2 and the conventional two charge layer structure is also identical to the structure of FIG. 2, other than for the fact that the remote charge layers 15 and 45 are omitted. The advantage of four charge reservoir layer structure is that the electron density in the quantum well is defined only by the doping density in the two surrounding charge layers, which, when doped with an equal impurity concentration, maintain a symmetric wavefunction and minimize excess scattering by ionized impurities in the barrier layers due to minimal wavefunction penetration.

Figure 5:
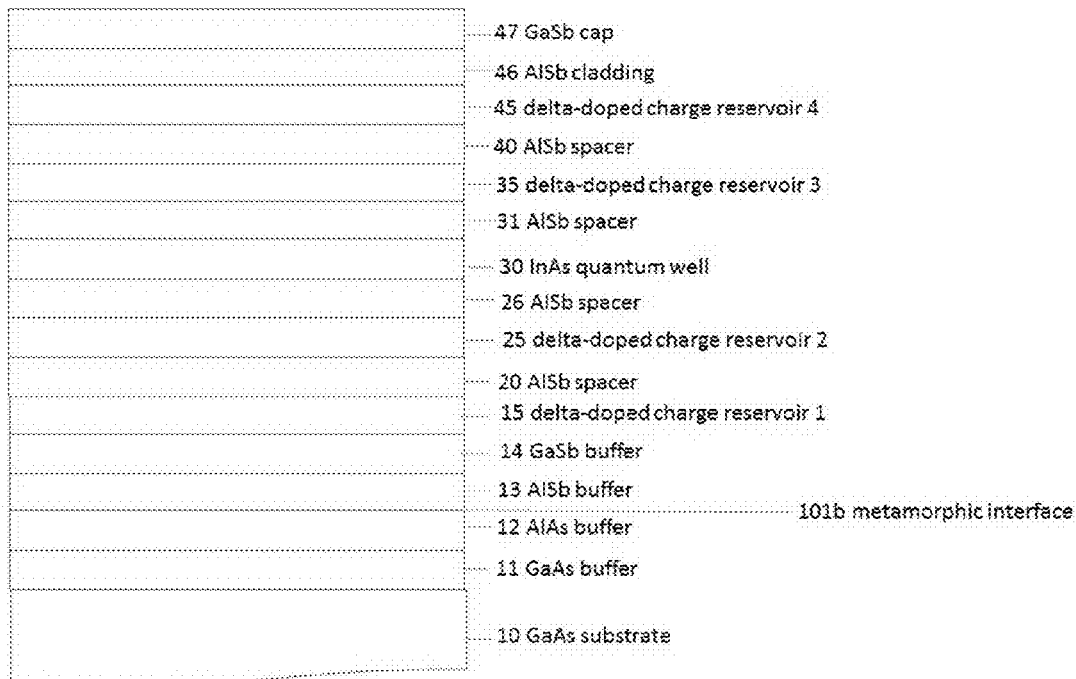

FIG. 5 illustrates an exemplary embodiment of the invention in which metamorphic growth is used. Referring also to the general schematic of a semiconductor heterostructure of FIG. 1, relaxed interface 101b is defined between substrate 10 and the layer structure 7. In this embodiment, the lattice constant of the layer structure 7 differs significantly from the lattice constant of the substrate 10. Accordingly, the large lattice mismatch may lead to the formation of threading dislocations that may propagate into the layer structure. Depending on the material of layer structure 7, threading dislocations at the interface 101b result in interface trap states due to antisite defects that can be acceptor-like (for example when the layers above the interface 101b are gallium-rich, aluminum-rich or both gallium and aluminum-rich, i.e. gallium antimonide, aluminum antimonide, aluminum gallium antimonide) or donor-like (indium-rich layer structure 7, for example InGaAs, InAs, etc.). Such interface states modify the carrier concentration in the quantum well layer by either depleting or enriching with carriers, depending on the interface state type.

To improve the layer quality by reducing threading dislocation densities, a buffer layer thicker than typically used in lattice-matched structures may be preferred.

Figure 6A:
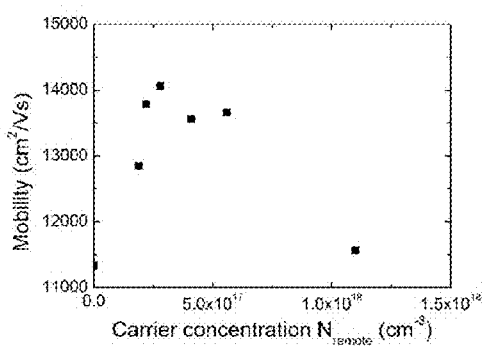
Figure 6B:
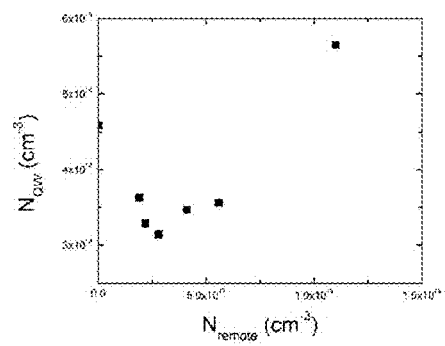

A typical example of a metamorphic high-mobility semiconductor heterostructure is given in FIG. 5 and experimental data for carrier mobility and carrier concentration in the quantum well as a function of charge concentration in the remote bottom charge layer is given in FIGS. 6a and 6b. The structure in FIG. 5 may be manufactured by conventional epitaxial crystal growth technique such as molecular beam epitaxy or metal-organic vapor phase epitaxy. A plurality of buffer layers may be formed on a semi-insulating substrate 10, such as GaAs. The thickness and composition of the buffer layers may be determined by one skilled in the art. In this particular example, the first buffer layer 11 is lattice-matched to the substrate, and may be, for example, GaAs, with a thickness selected from a range of at least 10 nm-several 100s nm, followed by the formation of a high-bandgap lattice-matched material 12, such as AlAs, which may be at least 10 nm thick, e.g., 100 nm. The high-bandgap buffer layer 12 is used as nucleation layer for the following high-bandgap, lattice-mismatched buffer layer 13, for example AlSb. AlSb grows favorably on AlAs and metamorphic interface results in lower density of dislocations. See, e.g., G. Tuttle, H. Kroemer, J. H. English, "Effects of interface layer sequencing on the transport properties of InAs/AlSb quantum wells: evidence for antisite donors at the InAs/AlSb interface," *J. Appl. Phys.*, 67, 3032 (1990), incorporated herein by reference in its entirety.

A thick buffer layer 14 is grown on lattice-mismatched buffer layer 13. The thick buffer layer 14 has a lattice constant of the desired virtual substrate, for instance GaSb as in FIG. 5. This layer is preferably sufficiently thick to minimize threading dislocation propagation but at the same time as thin as possible to minimize growth time. An appropriate thickness of the virtual substrate, i.e., of the thick buffer layer, depends on exact growth conditions, and may range from at least 50 nm to a several hundred nm.

Due to a metamorphic nature of the structure, the antisite defects created by threading dislocations result in p-type background impurities in the GaSb buffer layer 14 and n-type impurities in the InAs quantum well layer 30 as shown in the exemplary structure of FIG. 5. This leads to excess carrier concentration in the quantum well layer and, in turn, a decrease in mobility. To counteract this effect, a first remote charge reservoir layer 15 is included, which can be either bulk or delta-doped with impurities of the type opposite to that of the interface states due to antisite defect formation. In the structure shown in FIG. 5 the remote charge reservoir layer 15 is delta-doped with tellurium, acting as a donor in GaSb and AlSb. The impurity concentration in remote charge reservoir layer 15 is preferably substantially equal to the interface trap state density. An exact carrier density resulting from the interface strongly depends on actual growth conditions. In some embodiments, the carrier density is at least $10^{15}$ cm$^{-3}$ and may be as high as $10^{18}$ cm$^{-3}$.

Formation of the first charge reservoir layer 15 is followed by growth of a high-bandgap spacer layer 20, which physically separates the remote bottom charge reservoir layer 15 from the second charge reservoir layer 25. The second charge reservoir layer is grown on top of the spacer layer and is delta-doped with impurities and acts as a charge supply layer to the quantum well layer 30. For highest carrier mobility, donor type of impurities are preferred, for example Te. The thickness of the high-bandgap spacer layer 20 may be selected from a range of 1 nm-several hundred nm; a few tens of nm is typically sufficient. In between the quantum well and the second charge layer 25, a thin high bandgap spacer layer 26 may be formed that acts as a barrier to the quantum well and physically separates the electrons from ionized impurity atoms in the charge reservoir layer 25. The spacer layer 26 is preferably sufficiently thick to minimize the 2DEG wavefunction overlap with the donor ions in layer 25. Depending on the structure, the spacer may be at least 1 nm thick, e.g., 5-10 nm. An example of a suitable high-bandgap material for both spacer and barrier layers is AlSb.

The quantum well layer 30 may be formed from low-bandgap material with a low-effective mass and as high a carrier mobility as possible, e.g., a binary or a ternary material. A good choice for the quantum well is indium arsenide. Since the ground state of the quantum well has a symmetric wavefunction, a symmetric potential of the quantum well is desirable. For this purpose the growth of the quantum well is followed by growing an upper spacer layer 31, identical to the spacer layer 26, which is then followed by adding a third charge reservoir layer 35, which acts as a second charge supply layer to the quantum well layer 30. The thickness of the quantum well may be chosen such that the wavefunction of the 2DEG ground state does not penetrate the surrounding barrier materials of the spacer layer 26 and upper spacer layer 31. If the substrate interface trap states are compensated by the remote first charge reservoir layer 15, the donor concentration in the third charge reservoir layer 35 is kept substantially the same as in second charge layer 25, providing symmetric potential and charge supply in the same manner as in the lattice-matched case.

Formation of the third charge reservoir layer 35 may be followed by growth of the high-bandgap spacer layer 40, which typically includes a high bandgap material, preferably of the same composition as the spacer layers 26, 31, e.g., AlSb. The upper spacer layer 40 acts as a barrier to the quantum well, i.e., provides confinement in the growth direction for the 2 dimensional electron gas (2DEG) carriers. Keeping the composition of the upper barrier layer 40 the same as that of the high-bandgap first barrier layer 20 is simpler from a manufacturing standpoint, as well as also ensuring a symmetric potential for the 2DEG. The upper spacer layer is followed by growth of the fourth charge reservoir layer 45, which is the top remote charge layer. The role of the fourth charge reservoir layer 45 is to compensate the surface (typically, air)-semiconductor interface trap states in the same way as is explained in the lattice-matched high-mobility semiconductor heterostructure case.

The structure may be finalized with a layer of high bandgap cladding material such as AlSb 46, followed by a lower bandgap, aluminum-free cap layer 47, which is preferably thick enough to provide proper passivation of the layer structure to avoid oxidation, e.g., at least 1 nm thick. To avoid rapid oxidation, the cap layer 47 may be made from an aluminum-free material, such as GaSb.

Referring to FIGS. 6a and 6b, a maximum mobility is reached when the remote charge reservoir layer carrier concentration is substantially equal to the carrier density produced by the interface states. The presence of the interface states and the effect of compensation is clearly seen in FIG. 6b, where carrier concentration in the quantum well is plotted as a function of carrier concentration in the remote charge reservoir layer, e.g., first charge reservoir layer 15. A clear minimum can be seen at $N_{remote} \sim 2.8e17$ cm$^{-3}$. This minimum corresponds to the carrier concentration substantially equal to the substrate/heterostructure interface trap state density due to antisite defect formation by threading dislocations. The doping density of the top remote charge layer was kept at 10e16 cm$^{-3}$ to take care of the surface effects. Once this situation is reached, a maximum in the carrier mobility is observed (FIG. 6a) and a minimum in the quantum well carrier concentration (FIG. 6b). Further increasing the doping level in the first charge reservoir layer 15 leads to an increase in quantum well carrier concentration and a reduction in mobility due to excess carrier-carrier scattering. In the case where no interface states exist, a monotonic increase of carrier concentration in the quantum well is seen as the doping level in the remote charge reservoir layer 15 increases. In the illustrated case, the interface states resulted in a carrier concentration of $\sim 2.8e17$ cm$^{-3}$, corresponding to a carrier mobility of 14 000 cm$^2$/Vs. This carrier mobility value is 30% higher in comparison to a prior art case, when the remote charge layer is absent (corresponds to $N_{remote} = 0$ cm$^{-3}$ in FIG. 6).

The heterostructures described above can be used for a variety of device applications such as galvanomagnetic sensors, high-electron-mobility transistors ("HEMTs"), metal-semiconductor field effect transistors ("MESFETs"), and pseudomorphic high-electron-mobility transistors ("pHEMTs").

Figures 7A, 7B:
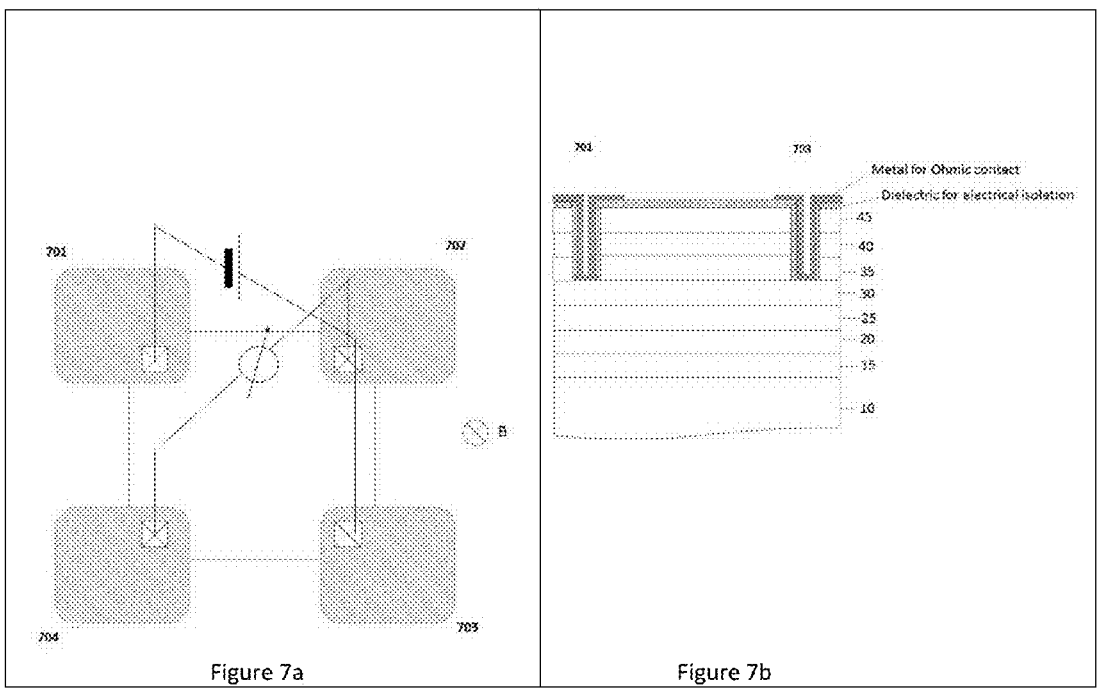
FIGS. 7a and 7b are schematic diagrams, top view and cross section respectively, illustrating a Hall effect sensor incorporating a high-mobility semiconductor heterostructure in accordance with an embodiment of the invention.

An example of a simple galvanomagnetic device, also referred to as a Hall effect sensor, is shown in FIGS. 7a and 7b. Here, a planar configuration Hall cross structure with four contacts is realized. A voltage is applied between two diagonally disposed contacts, for example contacts 701 and 703. In case magnetic field B, perpendicular to the quantum well plane is present, it will result in a voltage drop between the other contact pair, for example contacts 702 and 704, due to a Hall effect. This voltage drop is typically called the Hall voltage. The magnitude of this voltage is proportional to the strength of the magnetic field, carrier mobility, and carrier concentration. The important device parameter for Hall sensors is the current and voltage sensitivity, which reflects the change in the Hall voltage as a function of the change of the magnetic field strength at a fixed bias voltage or current point. Voltage sensitivity is directly proportional to carrier mobility, whereas current sensitivity is inversely proportional to the carrier concentration. Therefore heterostructures with high-mobility in a wide carrier concentration range are desired for high-sensitivity Hall sensors.

Hall sensors, such as the device shown in FIGS. 7a (top view) and 7b (cross section), can be fabricated by realizing a lattice-matched or metamorphic semiconductor heterostructure by epitaxial growth as described in detail above. The epitaxial wafer, including the substrate and layer structure, is then passivated with a dielectric material, for example silicon dioxide or silicon nitride and spin-coated with photoresist, and contact holes are developed in the photoresist. Using the photoresist layer as a mask, the contact holes are etched into the semiconductor layer structure by wet-chemical or dry etching. The etching preferably stops at the quantum well layer 30. The etching step is followed with contact hole sidewall passivation, keeping an open area at the bottom of the contact hole by use of photolithography and dielectric etching. Then, non-blocking ohmic contact pads are defined over a dielectric layer with appropriate materials, such as metal, for example TiPtAu or GeAuNiAu, etc. The processing of lattice-matched and metamorphic structure is identical.

The described embodiments of the invention are intended to be merely exemplary and numerous variations and modifications will be apparent to those skilled in the art. For example, many of the illustrative embodiments of charge reservoir layers include n-type dopants, i.e., donors. Other embodiments of the invention may include p-type dopants, i.e., acceptors. A heterostructure may have a single remote charge reservoir layer. All such variations and modifications are intended to be within the scope of the present invention as defined in the appended claims.

We claim:

1. A semiconductor heterostructure comprising:
   a layer structure including:
      a first charge reservoir layer, a second charge reservoir layer, a third charge reservoir layer and a fourth charge reservoir layer disposed over a substrate, each charge reservoir layer comprising a dopant type selected from the group consisting of donors and acceptors; and
      an undoped quantum well layer disposed between the second and third charge reservoir layers,
   wherein (i) the first charge reservoir layer is disposed over the substrate, the second charge reservoir layer is disposed over the first charge reservoir layer, the third charge reservoir layer is disposed over the second reservoir layer, and the fourth charge reservoir layer is disposed over the third charge reservoir layer, (ii) the first and fourth charge reservoir layers are remote from the quantum well layer, (iii) the second and third charge reservoir layers are proximate the quantum well layer, and (iv) a sheet doping density of at least one of the charge reservoir layers remote from the quantum well layer is substantially equal to a surface state sheet density of the layer structure.

2. The semiconductor heterostructure of claim 1, wherein (i) the second and third charge reservoir layers between which the quantum well layer is disposed comprise a first type of dopant, (ii) an interface between a top surface of the layer structure and air comprises a second type of surface states, (iii) each of the first and second dopant types are selected from the group consisting of donors and acceptors, and (iv) the first and second dopant types are different.

3. The semiconductor heterostructure of claim 1 wherein (i) the at least one of the charge reservoir layer remote from the quantum well layer comprises a first type of dopant, (ii) an interface between the substrate and the layer structure comprises a second type of interface states, (iii) each of the first and second dopant types are selected from the group consisting of donors and acceptors, and (iv) the first dopant type is different from the second dopant type.

4. The semiconductor heterostructure of claim 1, wherein the substrate is lattice-matched to the layer structure.

5. The semiconductor heterostructure of claim 4, wherein the layer structure comprises at least one of (AlGaIn)(As)-containing layers disposed on a GaAs substrate and (AlGaIn)(AsP)-containing layers disposed on an InP substrate.

6. The semiconductor heterostructure of claim 1, wherein the substrate is not lattice-matched to the layer structure.

7. The semiconductor heterostructure of claim 6, wherein the layer structure comprises (AlGaIn)(AsSb)-containing layers disposed on a GaAs substrate.

8. The semiconductor heterostructure of claim 1, wherein the two charge reservoir layers proximate the quantum well layer comprise dopants of the same type at substantially equal concentrations.

9. The semiconductor heterostructure of claim 1, further comprising a plurality of layers disposed between one of the charge reservoir layers proximate the quantum layer and the charge reservoir layers remote from the quantum well layer.

10. The semiconductor heterostructure of claim 1, further comprising a spacer layer disposed between one of the charge reservoir layers proximate the quantum well layer and one of the charge reservoir layer remote from the quantum well layer.

11. The semiconductor heterostructure of claim 1, further including at least one of an upper barrier layer and a cap layer disposed over the fourth charge reservoir layer.

12. The semiconductor heterostructure of claim 1, wherein the quantum well layer comprises at least a ternary composition, the layer structure further comprising a first binary material layer disposed between the quantum well layer and one of the two proximate charge reservoir layers.

13. The semiconductor heterostructure of claim 12, further comprising a second binary material layer disposed between the quantum well layer and the second of the two proximate charge reservoir layers.

14. A semiconductor heterostructure, comprising:
a layer structure including:
a first charge reservoir layer, a second charge reservoir layer, a third charge reservoir layer and a fourth charge reservoir layer disposed over a substrate, each charge reservoir layer comprising a dopant type selected from the group consisting of donors and acceptors; and
an undoped quantum well layer disposed between the second and third charge reservoir layers,
wherein (i) the first charge reservoir layer is disposed over the substrate, the second charge reservoir layer is disposed over the first charge reservoir layer, the third charge reservoir layer is disposed over the second reservoir layer, and the fourth charge reservoir layer is disposed over the third charge reservoir layer, (ii) the first and fourth charge reservoir layers are remote from the quantum well layer, (iii) the second and third charge reservoir layers are proximate the quantum well layer, and (iv) the charge reservoir layers remote from the quantum well layer have a dopant type and concentration that enables the incorporation of a reduced dopant concentration in the two charge reservoir layers proximate the quantum well layer in comparison to a heterostructure without the remote charge reservoir layers, while maintaining constant a carrier concentration in the quantum well layer.

15. The semiconductor heterostructure of claim 14, wherein (i) the second and third charge reservoir layers between which the quantum well layer is disposed comprise a first type of dopant, (ii) an interface between a top surface of the layer structure and air comprises a second type of surface states, (iii) each of the first and second dopant types are selected from the group consisting of donors and acceptors, and (iv) the first and second dopant types are different.

16. The semiconductor heterostructure of claim 14 wherein (i) the at least one of the charge reservoir layer remote from the quantum well layer comprises a first type of dopant, (ii) an interface between the substrate and the layer structure comprises a second type of interface states, (iii) each of the first and second dopant types are selected from the group consisting of donors and acceptors, and (iv) the first dopant type is different from the second dopant type.

17. The semiconductor heterostructure of claim 14, wherein the substrate is lattice-matched to the layer structure.

18. The semiconductor heterostructure of claim 17, wherein the layer structure comprises at least one of (AlGaIn)(As)-containing layers disposed on a GaAs substrate and (AlGaIn)(AsP)-containing layers disposed on an InP substrate.

19. The semiconductor heterostructure of claim 14, wherein the substrate is not lattice-matched to the layer structure.

20. The semiconductor heterostructure of claim 19, wherein the layer structure comprises (AlGaIn)(AsSb)-containing layers disposed on a GaAs substrate.

21. The semiconductor heterostructure of claim 14, wherein the two charge reservoir layers proximate the quantum well layer comprise dopants of the same type at substantially equal concentrations.

22. The semiconductor heterostructure of claim 14, further comprising a plurality of layers disposed between one of the charge reservoir layers proximate the quantum layer and the charge reservoir layers remote from the quantum well layer.

23. The semiconductor heterostructure of claim 14, further comprising a spacer layer disposed between one of the charge reservoir layers proximate the quantum well layer and one of the charge reservoir layer remote from the quantum well layer.

24. The semiconductor heterostructure of 14, further comprising at least one of an upper barrier layer and a cap layer disposed over the fourth charge reservoir layer.

25. The semiconductor heterostructure of claim 14, wherein the quantum well layer comprises at least a ternary composition, the layer structure further comprising a first binary material layer disposed between the quantum well layer and one of the two proximate charge reservoir layers.

26. The semiconductor heterostructure of claim 25, further comprising a second binary material layer disposed between the quantum well layer and the second of the two proximate charge reservoir layers.

27. A method for manufacturing a semiconductor heterostructure, the method comprising the steps of:
forming a layer structure by:
forming sequentially a first, a second, a third, and a fourth charge reservoir layer over a substrate, each charge reservoir layer comprising a dopant type selected from the group consisting of donors and acceptors; and
forming an undoped quantum well layer between the second and third charge reservoir layers,
wherein (i) the first charge reservoir layer is disposed over the substrate, the second charge reservoir layer is disposed over the first charge reservoir layer, the third charge reservoir layer is disposed over the second reservoir layer, and the fourth charge reservoir layer is disposed over the third charge reservoir layer, (ii) the first and fourth charge reservoir layers are remote from the quantum well layer, (iii) the second and third charge reservoir layers are proximate the quantum well layer, and (iv) a sheet doping density of at least one of the charge reservoir layers remote from the quantum well layer is substantially equal to a surface state sheet density of the layer structure.

28. The method of claim 27, wherein forming at least one of the charge reservoir layers comprises forming a delta-doped layer.

29. The method of claim 27, wherein forming at least one of the charge reservoir layers comprises growing an undoped layer and subsequently doping the undoped layer.

30. The method of claim 27, wherein forming at least one of the charge reservoir layers comprises forming a doped layer by at least one of molecular beam epitaxy and metalorganic chemical vapor deposition.

31. The method of claim 27, further comprising forming a spacer layer between one of the charge reservoir layers proximate the quantum well layer and one of the charge reservoir layer remote from the quantum well layer.

32. A method for manufacturing a semiconductor heterostructure, the method comprising the steps of:

forming a layer structure by:

forming sequentially a first, a second, a third, and a fourth charge reservoir layer over a substrate, each charge reservoir layer comprising a dopant type selected from the group consisting of donors and acceptors; and forming an undoped quantum well layer between the second and third charge reservoir layers, wherein (i) the first charge reservoir layer is disposed over the substrate, the second charge reservoir layer is disposed over the first charge reservoir layer, the third charge reservoir layer is disposed over the second reservoir layer, and the fourth charge reservoir layer is disposed over the third charge reservoir layer, (ii) the first and fourth charge reservoir layers are remote from the quantum well layer, (iii) the second and third charge reservoir layers are proximate the quantum well layer, and (iv) the charge reservoir layers remote from the quantum well layer have a dopant type and concentration that enables the incorporation of a reduced dopant concentration in the two charge reservoir layers proximate the quantum well layer in comparison to a heterostructure without the remote charge reservoir layers, while maintaining constant a carrier concentration in the quantum well layer.

* * * * *